United States Patent
Fujimura et al.

(10) Patent No.: US 12,007,822 B2
(45) Date of Patent: Jun. 11, 2024

(54) POWER SUPPLY SHUTOFF DEVICE AND POWER SUPPLY SHUTOFF METHOD

(71) Applicant: FUJI CORPORATION, Chiryu (JP)

(72) Inventors: Shingo Fujimura, Toyoake (JP); Sota Mizuno, Okazaki (JP); Yusuke Saito, Okazaki (JP); Takeshi Aoki, Chita (JP); Masato Yamagiwa, Obu (JP); Takashi Hirano, Nagoya (JP); Shigenori Tanakamaru, Anjo (JP)

(73) Assignee: FUJI CORPORATION, Chiryu (JP)

( * ) Notice: Subject to any disclaimer, the term of this patent is extended or adjusted under 35 U.S.C. 154(b) by 30 days.

(21) Appl. No.: 17/904,826

(22) PCT Filed: Feb. 27, 2020

(86) PCT No.: PCT/JP2020/007913
§ 371 (c)(1),
(2) Date: Aug. 23, 2022

(87) PCT Pub. No.: WO2021/171453
PCT Pub. Date: Sep. 2, 2021

(65) Prior Publication Data
US 2023/0114864 A1    Apr. 13, 2023

(51) Int. Cl.
*G06F 1/3203* (2019.01)
*H02J 50/12* (2016.01)
*H05K 13/08* (2006.01)

(52) U.S. Cl.
CPC ............ *G06F 1/3203* (2013.01); *H02J 50/12* (2016.02); *H05K 13/0885* (2018.08); *H05K 13/0888* (2018.08)

(58) Field of Classification Search
CPC ......... G06F 1/3203; H02J 50/10; H02J 50/12; H05K 13/02; H05K 13/08; H05K 13/086; H05K 13/0885; H05K 13/0888
See application file for complete search history.

(56) References Cited

U.S. PATENT DOCUMENTS

| 4,616,216 A | 10/1986 | Meirow et al. |
| 2015/0249366 A1* | 9/2015 | Takikawa ................ H02J 50/05 307/109 |

(Continued)

FOREIGN PATENT DOCUMENTS

| EP | 3 611 834 A1 | 2/2020 |
| JP | 2004-47862 A | 2/2004 |

(Continued)

OTHER PUBLICATIONS

International Search Report mailed on Mar. 24, 2020 in PCT/JP2020/007913 filed on Feb. 27, 2020 (2 pages).

*Primary Examiner* — Levi Gannon
(74) *Attorney, Agent, or Firm* — Oblon, McClelland, Maier & Neustadt, L.L.P.

(57) ABSTRACT

A power supply shutoff device includes a movable section, a driving section, a power supply device, a power distribution section, an electric power supply circuit, and a supply control section. The movable section is configured to travel on a traveling path provided along a board production line in which multiple board work machines, which perform a predetermined board work on a board, are installed side by side. The driving section is provided in the movable section and configured to cause the movable section to travel by using supply electric power supplied from the board work machine with non-contact power feeding. The supply control section is configured to stop a supply of the electric power to the electric power supply circuit when drive electric power for driving the board work machine is shut off in at least one board work machine among the multiple board work machines.

11 Claims, 6 Drawing Sheets

(56) References Cited

U.S. PATENT DOCUMENTS

| | | | |
|---|---|---|---|
| 2018/0241251 A1* | 8/2018 | Nomura | B60M 7/00 |
| 2018/0262063 A1* | 9/2018 | Oki | H01F 27/2871 |
| 2019/0045682 A1 | 2/2019 | Yamamoto | |

FOREIGN PATENT DOCUMENTS

| | | |
|---|---|---|
| JP | 2017-63526 A | 3/2017 |
| WO | WO 2017/141365 A1 | 8/2017 |
| WO | WO 2019/239510 A1 | 12/2019 |

* cited by examiner

POWER SUPPLY SHUTOFF DEVICE AND POWER SUPPLY SHUTOFF METHOD

TECHNICAL FIELD

The present specification discloses a technique related to a power supply shutoff device and a power supply shutoff method.

BACKGROUND ART

In a non-contact power feeding device described in Patent Literature 1, a fixed portion is a board production line in which multiple board production machines are arranged, and a movement direction of a moving body is set in an arrangement direction of the multiple board production machines. An equal number of power feeding coils are disposed in each of the multiple board production machines, and at least one power receiving coil is disposed in the moving body. When the power feeding coil of one board production machine is enabled to feed power to the power receiving coil, the power feeding from the power feeding coil to the power receiving coil is started.

PATENT LITERATURE

Patent Literature 1: International Publication No. WO2017/163388

BRIEF SUMMARY

Technical Problem

In the non-contact power feeding device described in Patent Literature 1, an embodiment in which an electric power supply circuit is provided in each of multiple board work machines is assumed. The electric power supply circuit generates supply electric power to be supplied to a driving section by using the electric power distributed via a power distribution section. In this embodiment, even when the drive electric power for driving the board work machine is shut off, there is a possibility that the electric power is continuously supplied to the electric power supply circuit via the power distribution section. Since there is a possibility that a worker performs a maintenance work or the like when the drive electric power for driving the board work machine is shut off, it is desirable to stop the supply of electric power to the electric power supply circuit when the drive electric power for driving the board work machine is shut off.

In view of such a circumstance, the present specification discloses a power supply shutoff device capable of stopping the supply of the electric power to the electric power supply circuit when the drive electric power for driving the board work machine is shut off.

Solution to Problem

The present specification discloses a power supply shutoff device including a movable section, a driving section, a power supply device, a power distribution section, an electric power supply circuit, and a supply control section. The movable section is configured to travel on a traveling path provided along a board production line in which multiple board work machines, which perform a predetermined board work on a board, are installed side by side. The driving section is provided in the movable section and is configured to cause the movable section to travel by using supply electric power supplied from the board work machine with non-contact power feeding. The power supply device is configured to generate electric power. The power distribution section is configured to distribute the electric power generated by the power supply device to each of the multiple board work machines. The electric power supply circuit is provided in each of the multiple board work machines and is configured to generate the supply electric power to be supplied to the driving section by using the electric power distributed via the power distribution section. The supply control section is configured to stop a supply of the electric power to the electric power supply circuit when drive electric power for driving the board work machine is shut off in at least one board work machine among the multiple board work machines.

Further, the present specification discloses a power supply shutoff method that is applied to a power feeding system including a movable section, a driving section, a power supply device, a power distribution section, and an electric power supply circuit and includes a supply control step. The movable section is configured to travel on a traveling path provided along a board production line in which multiple board work machines, which perform a predetermined board work on a board, are installed side by side. The driving section is provided in the movable section and is configured to cause the movable section to travel by using supply electric power supplied from the board work machine with non-contact power feeding. The power supply device is configured to generate electric power. The power distribution section is configured to distribute the electric power generated by the power supply device to each of the multiple board work machines. The electric power supply circuit is provided in each of the multiple board work machines and is configured to generate the supply electric power to be supplied to the driving section by using the electric power distributed via the power distribution section. The supply control step is configured to stop a supply of the electric power to the electric power supply circuit when drive electric power for driving the board work machine is shut off in at least one board work machine among the multiple board work machines.

Advantageous Effects

The power supply shutoff device described above includes a supply control section. Therefore, the power supply shutoff device can stop the supply of electric power to the electric power supply circuit when the drive electric power for driving the board work machine is shut off. What has been described above with respect to the power supply shutoff device can be said in the same manner as for the power supply shutoff method.

DESCRIPTION OF EMBODIMENTS

1. Embodiment 1-1. Configuration Example of Board Production Line 1

Figure 1:
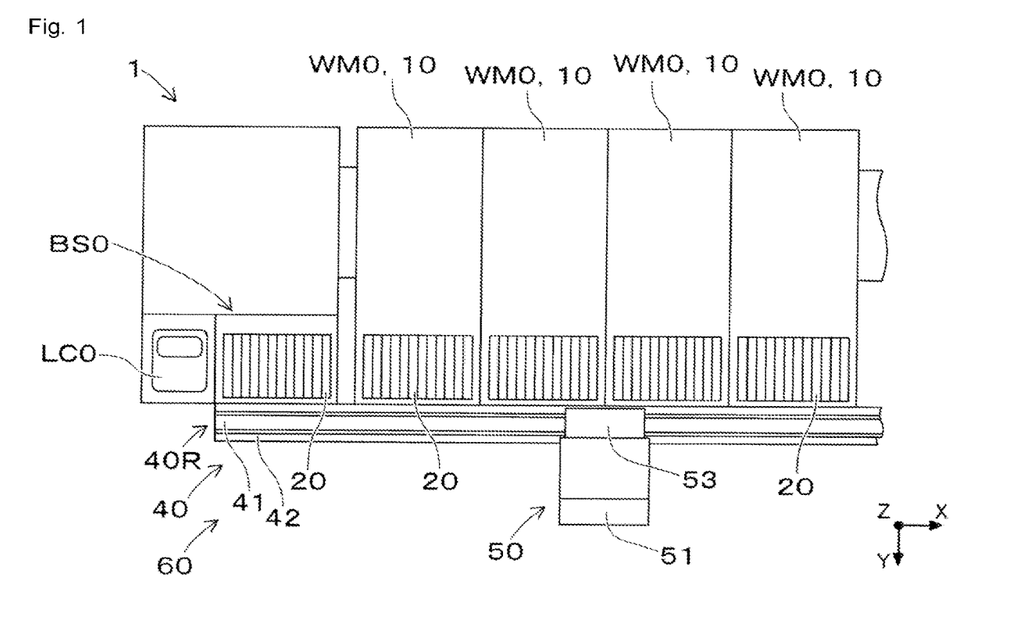
FIG. 1 is a plan view illustrating a configuration example of a board production line including a power feeding system.

Power supply shutoff device 70 of the present embodiment is applied to board production line 1. As illustrated in FIG. 1, in board production line 1, multiple component mounters 10 (four in the drawing) are installed side by side in a conveyance direction of board 90 illustrated in FIG. 2. Component mounter 10 is included in board work machine WM0 that performs a predetermined board work on board 90. Board production line 1 may be provided with various board work machines WM0 such as a screen printing machine, a solder inspection machine, an appearance inspection machine, and a reflow furnace.

Feeder storage device BS0 that is used to store cassette type feeder 20 is installed on a board carry-in side of board production line 1 (the left side of the drawing in FIG. 1). In board production line 1 of the present embodiment, traveling device 50, which serves as a work machine for performing predetermined operations with respect to each of multiple (four) component mounters 10 and feeder storage device BS0, is provided. Each device and traveling device 50 constituting board production line 1 are configured to be capable of inputting and outputting various data to and from line control device LC0 via a network. The detailed configuration of traveling device 50 will be described later.

Feeder storage device BS0 includes multiple slots. Feeder storage device BS0 stocks feeder 20 installed in each of the multiple slots. Feeder 20 that is installed in the slot of feeder storage device BS0 becomes in a state capable of communicating with line control device LC0. As a result, the slot of feeder storage device BS0 and the identification information of feeder 20, which is installed in the slot, are associated with each other and the results are recorded in line control device LC0.

Line control device LC0 monitors an operation status of board production line 1 and performs control of the production facility including component mounter 10, feeder storage device BS0, and traveling device 50. For example, line control device LC0 stores various data for controlling component mounter 10. Line control device LC0 appropriately transmits various data such as a control program to each production facility when a production process is executed in each production facility.

1-2. Configuration Example of Component Mounter 10

Figure 2:
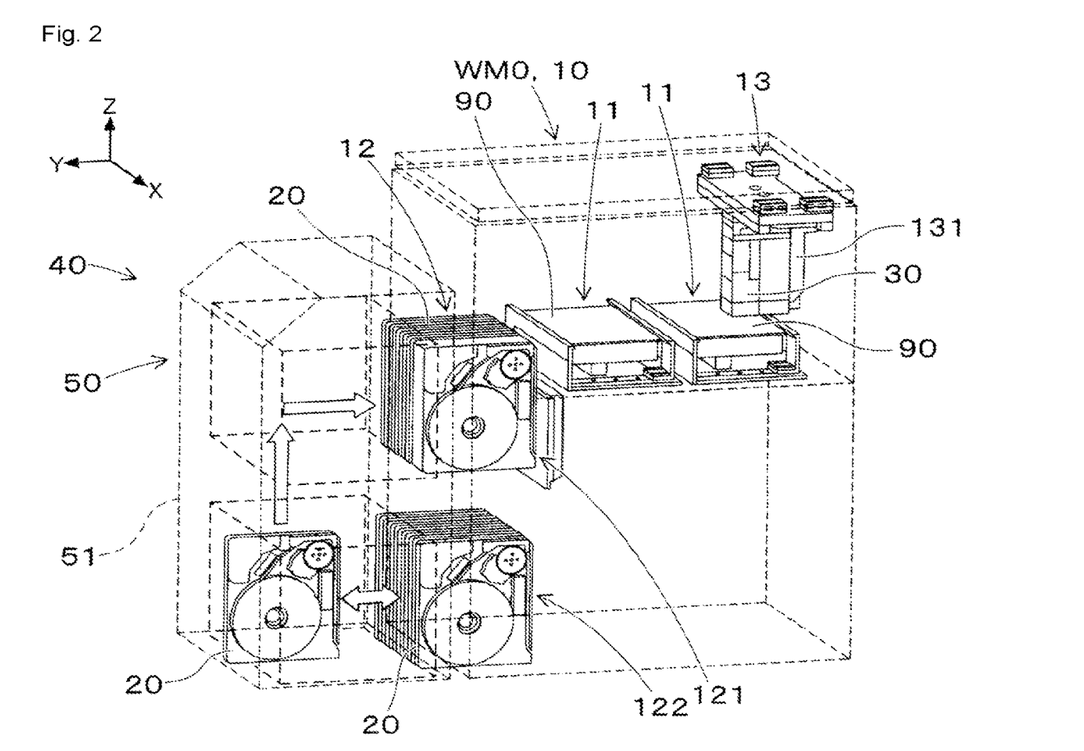
FIG. 2 is a perspective view illustrating a schematic configuration of a traveling device and a component mounter in FIG. 1.

As illustrated in FIG. 2, multiple (four) component mounters 10 constituting board production line 1 include board conveyance device 11, component supply device 12, and head drive device 13. In the following description, it is assumed that a horizontal width direction of component mounter 10, which is the conveyance direction of board 90, is an X direction, a horizontal depth direction of component mounter 10 is a Y direction, and a vertical direction (paper up-down direction of FIG. 2) perpendicular to the X direction and the Y direction is a Z direction.

Board conveyance device 11 is configured with a belt conveyor, a positioning device, and the like. Board conveyance device 11 sequentially conveys board 90 in the conveyance direction (X direction) and positions board 90 at a predetermined position in the machine. Board conveyance device 11 carries board 90 out of component mounter 10 after a mounting process by component mounter 10 is ended.

Component supply device 12 supplies a component to be mounted on board 90. Component supply device 12 includes upper slot 121 and lower slot 122 in which feeder 20 can be installed. Upper slot 121 is disposed in an upper portion on a front portion side of component mounter 10 and holds installed feeder 20 in an operational manner. That is, the operation of feeder 20 installed in upper slot 121 is controlled in the mounting process by component mounter 10, and the component is supplied from a pick up section provided in a defined position of the upper portion of feeder 20.

Lower slot 122 is disposed below upper slot 121 and stocks installed feeder 20. That is, lower slot 122 preliminarily holds feeder 20 used for production. Further, lower slot 122 temporarily holds the used feeder 20 used for production. The exchange of feeder 20 between upper slot 121 and lower slot 122 is performed by an automatic exchange by traveling device 50 described later or a manual exchange by the worker.

Further, when feeder 20 is installed in upper slot 121 or lower slot 122 of component supply device 12, the electric power is supplied from component mounter 10 via a connector. Thereafter, feeder 20 becomes in a state capable of communicating with component mounter 10. Feeder 20 that is installed in upper slot 121 controls a feeding operation of a carrier tape accommodating the component based on a control command by component mounter 10. As a result, feeder 20 supplies the component so as to be able to be picked up by a holding member of mounting head 30 described later at the pick up section provided upper portion of feeder 20.

Head drive device 13 transfers the component supplied by component supply device 12 to a predetermined mounting position on board 90 carried in the machine by board conveyance device 11. Head drive device 13 moves moving platform 131 in the horizontal direction (X direction and Y direction) by a linear motion mechanism. Mounting head 30 is exchangeably fixed to moving platform 131 by a clamp member. Mounting head 30 picks up the component, adjusts the position and the angle of the component in the up-down direction, and places the component on board 90.

Specifically, the holding member for holding the component that is supplied by feeder 20 is attached to mounting head 30. As the holding member, for example, a suction nozzle that holds the component by using the supplied negative pressure air, a chuck that grips and holds the component, or the like can be applied. Mounting head 30 holds the holding member so as to be movable in the Z direction and to be rotatable about the θ axis parallel to the Z axis. Mounting head 30 is moved in the horizontal direction (the X direction and the Y direction) by the linear motion mechanism of head drive device 13.

Component mounter 10 described above executes the mounting process of placing the component on board 90. In the mounting process, component mounter 10 transmits a control signal to head drive device 13 based on the result of image processing, a detection result by various sensors, a control program stored in advance, or the like. As a result, the position and angle of the multiple holding members (for example, the suction nozzles) supported by mounting head 30 are controlled.

The holding member (for example, the suction nozzle) held by mounting head 30 can be appropriately changed according to the type of the component mounted on board 90 in the mounting process. For example, when the suction nozzle used in the mounting process to be executed is not held by mounting head 30, component mounter 10 causes mounting head 30 to hold the suction nozzle accommodated in a nozzle station. The nozzle station is installed in a predetermined position in component mounter 10 in an attachable and detachable manner.

1-3. Configuration Examples of Exchange System 40 and Traveling Device 50

Figure 3:
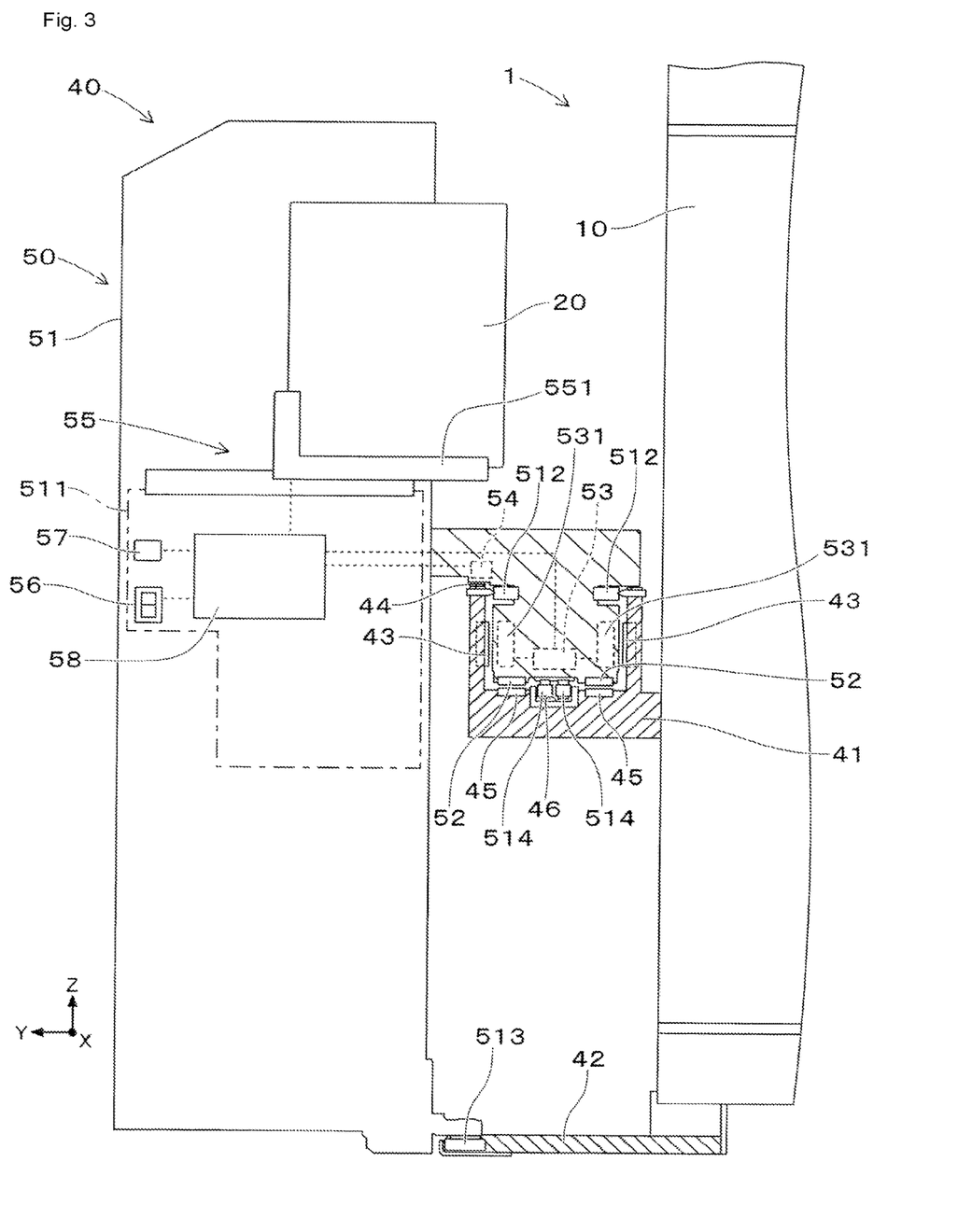
FIG. 3 is a side view illustrating the traveling device of FIG. 1.

As illustrated in FIGS. 1 to 3, exchange system 40 includes first rail 41, second rail 42, and traveling device 50. As illustrated in FIG. 1, first rail 41 and second rail 42 are fixed portions provided on a front portion of multiple component mounters 10. First rail 41 and second rail 42 of the present embodiment are formed of an electric conductor and constitute traveling path 40R of traveling device 50.

First rail 41 is provided between upper slot 121 and lower slot 122 in each of multiple (four) component mounters 10 in the up-down direction. Second rail 42 is provided below lower slot 122 of component mounter 10. First rail 41 and second rail 42 extend over substantially the entire area of board 90 in the conveyance direction (the X direction) in board production line 1.

Further, as illustrated in FIG. 3, first rail 41 is formed in a groove shape opened upward. On a pair of side wall portions of first rail 41, multiple magnets 43 are provided side by side in the X direction. Each of multiple magnets 43 is disposed such that an N pole and an S pole appear alternately in the X direction. Linear scale 44 extending in the X direction is provided on an upper surface of first rail 41. A pair of power transmitting sections 45 are disposed in the Y direction at a groove bottom portion of first rail 41. The pair of power transmitting sections 45 is a power transmission coil extending in the X direction. The pair of power transmitting sections 45 supplies the electric power to power receiving section 52 of traveling device 50 described later in a non-contact manner.

Further, on the pair of side wall portions of first rail 41, multiple first guide rollers 512 constituting movable section 51 of traveling device 50 are supported at an upper portion in a rollable manner. Further, traveling groove 46, in which multiple traveling rollers 514 constituting movable section 51 is rollable, is formed at the center of the groove bottom portion of first rail 41 in the Y direction. In second rail 42, second guide roller 513 constituting movable section 51 of traveling device 50 is supported in a rollable manner. According to the above configuration, first rail 41 and second rail 42 support traveling device 50 in the vertical direction and suppress the tilting of traveling device 50.

Traveling device 50 includes movable section 51, power receiving section 52, driving section 53, position detection section 54, work robot 55, maintenance switch 56, human sensing sensor 57, and control device 58. Movable section 51 is a main body of traveling device 50. Movable section 51 is provided so as to be capable of traveling along traveling path 40R formed by first rail 41 and second rail 42. Movable section 51 includes bracket 511, first guide roller 512, second guide roller 513, and traveling roller 514.

Bracket 511 is a frame member that supports driving section 53 and the like. First guide roller 512 is provided on bracket 511 and engaged with an upper portion of first rail 41 in a rollable manner. At this time, in first guide roller 512, the movement thereof in the X direction is allowed and the movements thereof in the Y direction and the Z direction are regulated. Second guide roller 513 is provided on bracket 511 and rolls along second rail 42.

Traveling roller 514 is provided on bracket 511 in a group of two side by side in the Y direction so as to be capable of rolling a pair of side wall portions of traveling groove 46 formed in a groove bottom portion of first rail 41. According to the above configuration, movable section 51 is capable of traveling along traveling path 40R formed by first rail 41 and second rail 42 while maintaining a posture of traveling device 50.

Power receiving section 52 is provided so as to form a pair on bracket 511 outside the Y direction of traveling roller 514. In the present embodiment, each of the pair of power receiving sections 52 is a power receiving coil extending in the X direction. Power receiving section 52 faces at least one power transmitting section 45 provided on first rail 41 regardless of the X direction position of movable section 51. As described later, AC power is supplied to power transmitting section 45 from electric power supply circuit 73 provided in each of multiple (four) component mounters 10. Electric power supply circuit 73 generates the AC power by using the electric power output from power supply device 71.

As a result, power transmitting section 45 and power receiving section 52 are electromagnetically coupled to form a magnetic path. As described above, power receiving section 52 can receive the electric power from power transmitting section 45 by, for example, the electromagnetic coupling type non-contact power feeding. The electric power received by power receiving section 52 is supplied to driving section 53, work robot 55, control device 58, and the like via power receiving circuit PR0 described later.

Driving section 53 is provided on movable section 51. Driving section 53 causes movable section 51 to travel by using the supply electric power supplied by the non-contact power feeding from board work machine WM0. Specifically, moving coil 531 is used for driving section 53. Moving coil 531 is disposed so as to face magnet 43 provided on first rail 41. Driving section 53 excites moving coil 531 by feeding power to moving coil 531. As a result, driving section 53 generates a thrust force between driving section 53 and magnet 43 in the X direction. As described above, driving section 53 constitutes a linear motor together with magnets 43 provided side by side on first rail 41 which is the fixed portion.

Position detection section 54 is disposed on bracket 511 so as to face linear scale 44 provided on first rail 41. Position detection section 54 detects the scale of linear scale 44 and detects the current position of movable section 51 on traveling path 40R. Position detection section 54 can detect the current position of movable section 51 by using various methods. For example, position detection section 54 can detect the current position of movable section 51 by using an optical detection method, a detection method using electromagnetic induction, or the like.

Work robot 55 is provided on movable section 51 to perform predetermined operations. The predetermined operations include an exchange operation for exchanging an exchange element, which is installed on board work machine WM0 such as component mounter 10 in an attachable and detachable manner, between the exchange element and board work machine WM0. Using feeder 20 that supplies the component mounted on board 90 as an exchange element, work robot 55 of the present embodiment performs the exchange operation of feeder 20 between multiple (four) component mounters 10 constituting board production line 1 and feeder 20, and between feeder storage device BS0 and feeder 20. The above exchange operation includes at least one of the collecting operation of feeder 20 and the replenishment operation of feeder 20.

Work robot 55 of the present embodiment conveys feeder 20 from feeder storage device BS0 to upper slot 121 or lower slot 122 of component mounter 10. Further, work robot 55 exchanges feeder 20 between upper slot 121 and lower slot 122 of component mounter 10. Further, work robot 55 conveys used feeder 20 from component mounter 10 to feeder storage device BS0. As illustrated in FIG. 3, holding portion 551 of work robot 55 holds feeder 20. Holding portion 551 is provided so as to be movable in the attaching and detaching direction of feeder 20 (in the present embodiment, the Y direction) and the up-down direction (the Z direction).

Maintenance switch 56 receives an operation by the worker and transmits a signal to control device 58. Control device 58 switches a control mode of traveling device 50 to a normal operation mode or a maintenance mode based on a state of maintenance switch 56. Maintenance switch 56 is operated by the worker, for example, when stop traveling of traveling device 50, a work error of work robot 55, or the like occurs, or when maintenance of the device used in board production line 1 is performed. In the maintenance mode, the traveling of movable section 51 and the work of work robot 55 are regulated.

Human sensing sensor 57 detects the presence of the worker in the vicinity and transmits a detection signal to control device 58. Human sensing sensor 57 detects the worker by using infrared light, ultrasonic waves, or the like, for example. Control device 58 can recognize whether the worker is approaching a predetermined range of traveling device 50 based on the presence or absence of the detection signal transmitted from human sensing sensor 57.

Control device 58 includes a computing device, a storage device, and a control circuit. Control device 58 is provided so as to be capable of communicating with multiple (four) component mounters 10, feeder storage device BS0, exchange system 40 including traveling device 50, line control device LC0, and the like, and can drive and control these devices. For example, traveling device 50 is driven and controlled by control device 58 to move to a predetermined position along first rail 41 and second rail 42, and to perform the exchange of feeder 20, which is the exchange element, in a stop position.

1-4. Configuration Examples of Power Feeding System 60 and Power Supply Shutoff Device 70

Figure 4:
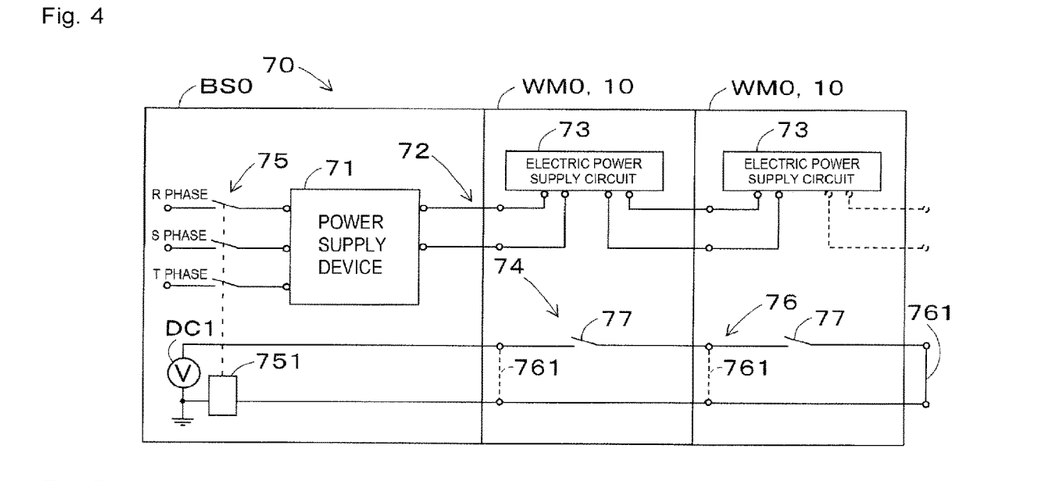
FIG. 4 is a schematic view illustrating a configuration example of a power supply shutoff device including a supply control section of a first embodiment.

As illustrated in FIGS. 1 and 4, power feeding system 60 includes movable section 51, driving section 53, power supply device 71, power distribution section 72, and electric power supply circuit 73. Power supply shutoff device 70 includes movable section 51, driving section 53, power supply device 71, power distribution section 72, electric power supply circuit 73, and supply control section 74. As described above, movable section 51 is capable of traveling on traveling path 40R provided along board production line 1 on which multiple board work machines WM0 for performing predetermined board works on board 90 are installed side by side. Driving section 53 is provided on movable section 51, and causes movable section 51 to travel by using the supply electric power that is supplied from board work machine WM0 with the non-contact power feeding.

Power supply device 71 generates the electric power. As power supply device 71, a known power supply device can be used, and various DC power or AC power can be generated. Power supply device 71 of the present embodiment is an electric power converter that converts the AC power of three phases (R phase, S phase, and T phase) into the DC power, and generates the DC power from the input AC power. Further, power supply device 71 can be provided, for example, in a work machine on one end side of board production line 1. Power supply device 71 of the present embodiment is provided in feeder storage device BS0.

Power distribution section 72 distributes the electric power, which is generated by power supply device 71, to each of multiple board work machines WM0. Power supply device 71 and multiple board work machines WM0 are electrically connected by, for example, a daisy chain connection, a bus connection, a star connection, or the like. In power distribution section 72 of the present embodiment, power supply device 71 and multiple board work machines WM0 are connected in a daisy chain manner, and power distribution section 72 sequentially distributes the electric power, which is generated by power supply device 71, from board work machine WM0 on a first end side of board production line 1 to board work machine WM0 on a second end side of board production line 1. In the drawing, for convenience of illustration, a state, in which power supply device 71 and multiple (two) component mounters 10 are connected in a daisy chain manner, is illustrated, but actually, power supply device 71 and multiple (four) component mounters 10 illustrated in FIG. 1 are connected in a daisy chain manner.

Electric power supply circuit 73 is provided in each of multiple board work machines WM0 and generates the supply electric power to be supplied to driving section 53 by using the electric power distributed via power distribution section 72. For example, the supply electric power is supplied to driving section 53 via power feeding circuit PS0 illustrated in FIG. 5. Power feeding circuit PS0 is an electrical circuit that performs the non-contact power feeding between board work machine WM0 and driving section 53 and includes power transmitting circuit PT0 and power receiving circuit PR0. Electric power supply circuit 73 supplies the AC power to power transmitting circuit PT0.

Figure 5:
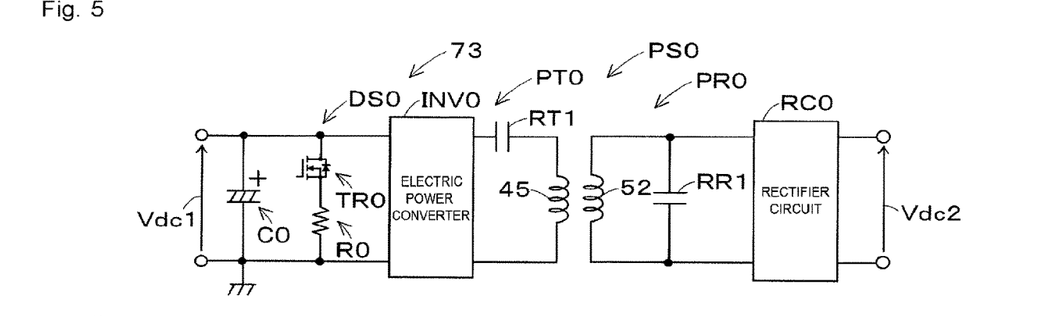
FIG. 5 is a circuit diagram illustrating an example of a power feeding circuit for performing non-contact power feeding between a board work machine and a driving section.

As illustrated in FIG. 5, electric power supply circuit 73 includes smoothing capacitor C0, discharge circuit DS0, and electric power converter INV0. Smoothing capacitor C0 and discharge circuit DS0 are connected in parallel on the input side of electric power converter INV0. The DC power that is input via power distribution section 72 (indicated by DC power Vdc1 in the drawing) is smoothed by smoothing capacitor C0 and is converted into the AC power by electric power converter INV0. Electric power converter INV0 is an electric power converter that converts the DC power into the AC power and can use a known electric power converter. Discharge circuit DS0 will be described later.

In power transmitting circuit PT0, power transmission side resonance section RT1 and power transmitting section 45 are connected in series, and a power transmission side resonance circuit is formed. For example, power transmission side resonance section RT1 can use a capacitor. Power transmitting section 45 can use a coil. Power receiving circuit PR0 includes power receiving section 52, power reception side resonance section RR1, and rectifier circuit RC0. Power receiving section 52 and power reception side resonance section RR1 are connected in parallel on the input side of rectifier circuit RC0, and a power reception side resonance circuit is formed. For example, power receiving section 52 can use a coil. Power reception side resonance section RR1 can use a capacitor.

Rectifier circuit RC0 is a rectifier circuit that rectifies the AC power supplied from power transmitting circuit PT0 and can use a known rectifier circuit. As described above, in the present embodiment, the DC power rectified by rectifier circuit RC0 (indicated by DC power Vdc2 in the drawing) is supplied to driving section 53, work robot 55, control device 58, and the like. Power receiving circuit PR0 may include an electric power converter that converts the DC power rectified by rectifier circuit RC0 into the AC power.

Supply control section 74 stops the supply of the electric power to electric power supply circuit 73 when the drive electric power for driving board work machine WM0 in at least one board work machine WM0 among multiple board work machines WM0 is shut off. Supply control section 74 only needs to be able to stop the supply of the electric power to electric power supply circuit 73 when the drive electric power for driving board work machine WM0 is shut off, and may take various forms. For example, supply control section 74 may be in a first embodiment or a second embodiment described below. Further, supply control section 74 may be in a combination of the first embodiment and the second embodiment.

1-5. Configuration Example of Supply Control Section 74 of First Embodiment

As illustrated in FIG. 4, supply control section 74 of a first embodiment includes electromagnetic contactor 75, excitation circuit 76, and work machine side switch 77. Electromagnetic contactor 75 is provided on the input side of power supply device 71 and allows the AC power to be input to power supply device 71 when electromagnetic coil 751 is excited. Specifically, when electromagnetic coil 751 is excited, a contact point of electromagnetic contactor 75 is in a closed state so that the AC power of the three phases (R phase, S phase, and T phase) is input to power supply device 71. Conversely, when electromagnetic coil 751 is not excited, the contact point of electromagnetic contactor 75 is in an open state so that the AC power of the three phases (R phase, S phase, and T phase) is not input to power supply device 71.

Excitation circuit 76 excites electromagnetic coil 751. Excitation circuit 76 of the present embodiment excites electromagnetic coil 751 with the DC power output from DC power source DC1. Work machine side switch 77 is provided in each of multiple board work machines WM0 and releases excitation circuit 76 when the drive electric power of at least one board work machine WM0 among multiple board work machines WM0 is shut off.

In excitation circuit 76, electromagnetic coil 751 and work machine side switch 77 are connected in series. Therefore, when work machine side switch 77, which is provided in at least one board work machine WM0 among multiple board work machines WM0 is switched from the closed state to the open state, excitation circuit 76 is released. As a result, electromagnetic coil 751 is not excited so that the AC power of the three phases (R phase, S phase, and T phase) is not input to power supply device 71. In other words, the supply of the electric power to electric power supply circuit 73 is stopped.

Work machine side switch 77 only needs to be able to switch work machine side switch 77 from the closed state to the open state in conjunction with the shutoff of the drive electric power of board work machine WM0, and may take various forms. Work machine side switch 77 of the present embodiment is a breaker capable of inputting or shutting off the drive electric power of board work machine WM0 by the worker. In this case, when the worker sets all the breakers of multiple board work machines WM0 to the closed state and the drive electric power of all board work machines WM0 is input, a path of excitation circuit 76 is closed and electromagnetic coil 751 is excited. As a result, the contact point of electromagnetic contactor 75 becomes in the closed state, the AC power of the three phases (R phase, S phase, and T phase) is input to power supply device 71, and the DC power is supplied to electric power supply circuit 73.

When the worker sets the breaker of at least one board work machine WM0 among multiple board work machines WM0 to the open state and shuts off the drive electric power of at least one board work machine WM0, excitation circuit 76 is released so that electromagnetic coil 751 is not excited. As a result, the contact point of electromagnetic contactor 75 becomes in the open state, the AC power of the three phases (R phase, S phase, and T phase) is not input to power supply device 71, and the supply of the electric power to electric power supply circuit 73 is stopped. As described above, since the work machine side switch 77 of the present embodiment is a breaker capable of inputting or shutting off the drive electric power of board work machine WM0 by the worker, work machine side switch 77 can be easily switched from the closed state to the open state in conjunction with the shutoff of the drive electric power of board work machine WM0.

Figure 6:
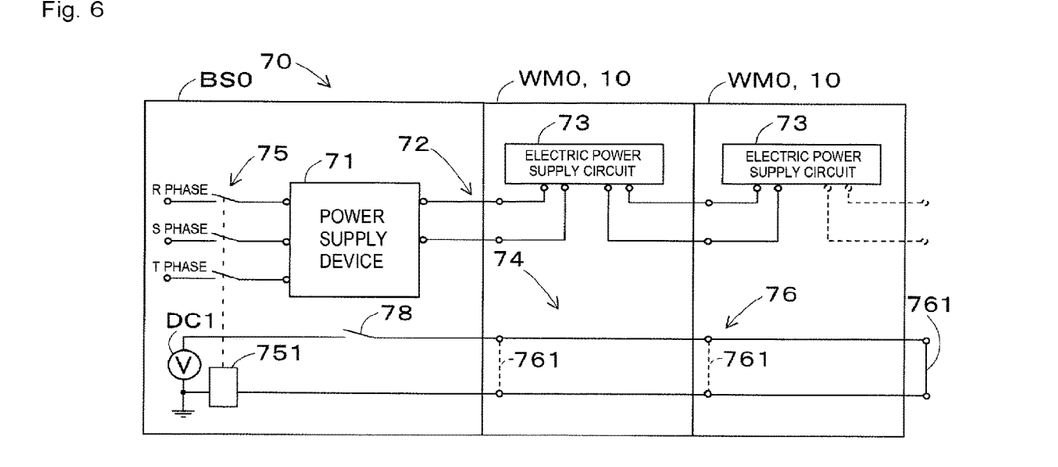
FIG. 6 is a schematic view illustrating a configuration example of a power supply shutoff device including a supply control section of a second embodiment.

1-6. Configuration Example of Supply Control Section 74 of Second Embodiment As illustrated in FIG. 6, supply control section 74 of a second embodiment includes electromagnetic contactor 75, excitation circuit 76, power supply side switch 78, and normal state checking section 80. Electromagnetic contactor 75 is similar to electromagnetic contactor 75 of supply control section 74 in the first embodiment. Power supply side switch 78 is provided in the work machine including power supply device 71 and releases excitation circuit 76 when the drive electric power of at least one board work machine WM0 among multiple board work machines WM0 is shut off. As described above, power supply device 71 is provided in feeder storage device BS0, and power supply side switch 78 of the present embodiment is provided in feeder storage device BS0.

Excitation circuit 76 excites electromagnetic coil 751 in the same manner as supply control section 74 of the first embodiment. However, in excitation circuit 76 of the present embodiment, electromagnetic coil 751 and power supply side switch 78 are connected in series. Therefore, when power supply side switch 78 provided in feeder storage device BS0 is switched from the closed state to the open state, excitation circuit 76 is released. As a result, electromagnetic coil 751 is not excited so that the AC power of the three phases (R phase, S phase, and T phase) is not input to power supply device 71. In other words, the supply of the electric power to electric power supply circuit 73 is stopped.

Figure 7:
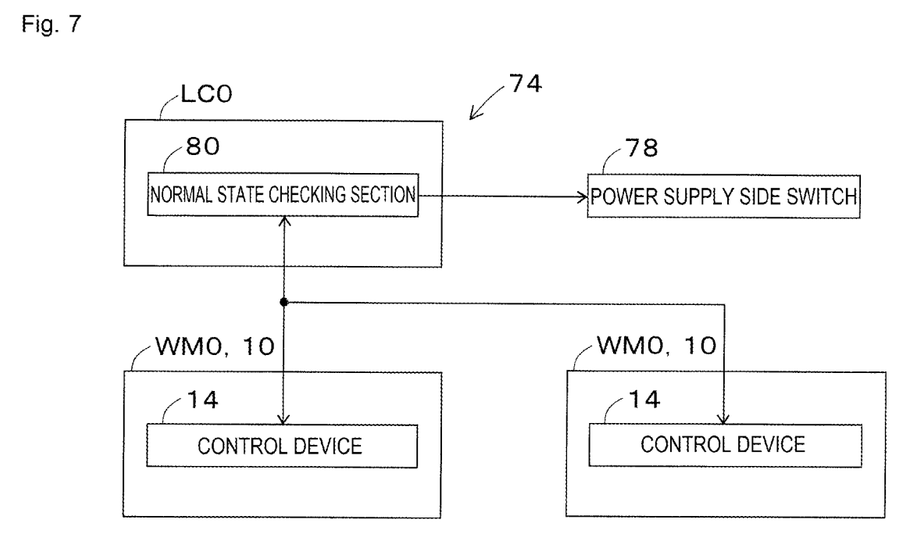
FIG. 7 is a block diagram illustrating an example of a control block of the supply control section of the second embodiment.

Normal state checking section 80 checks for the normal state in which board work machine WM0 is being operated normally for multiple board work machines WM0 each time the predetermined time elapses. Normal state checking section 80 sets power supply side switch 78 to the open state when the normal state cannot be checked for at least one board work machine WM0 among multiple board work machines WM0. As illustrated in FIG. 7, a normal state checking section 80 of the present embodiment is provided in line control device LC0 illustrated in FIG. 1. Normal state checking section 80 may be provided in a management device that manages multiple board production lines 1. Further, normal state checking section 80 may be formed on a cloud.

Normal state checking section 80 only needs to be able to check the normal state for multiple board work machines WM0 and set power supply side switch 78 to the open state when the normal state cannot be checked for at least one board work machine WM0, and may take various forms. For example, normal state checking section 80 tries to communicate with multiple board work machines WM0 each time the predetermined time elapses and can determine that the normal state cannot be checked when the communication with at least one board work machine WM0 among multiple board work machines WM0 cannot be performed.

Figure 8:
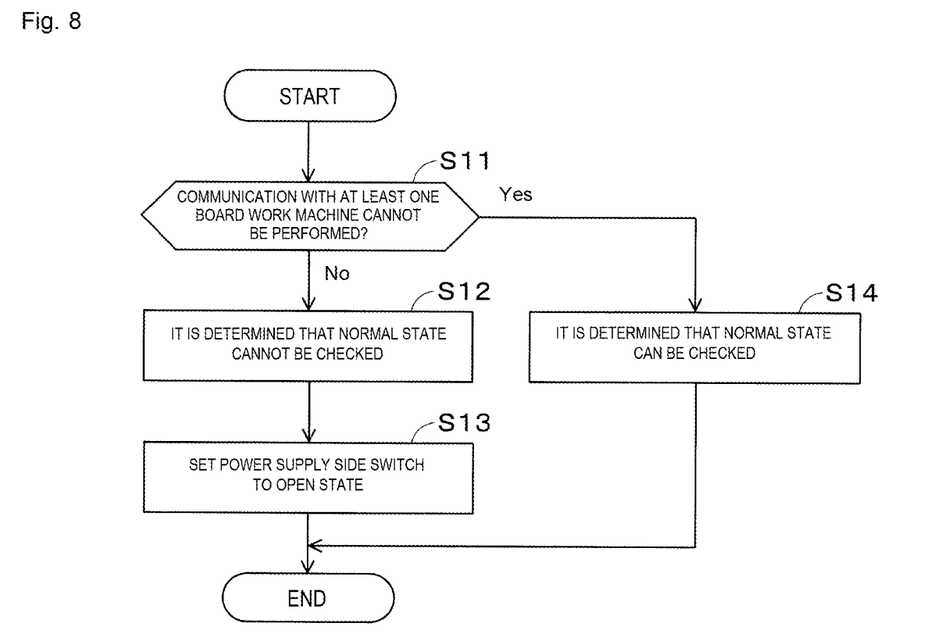
FIG. 8 is a flowchart illustrating an example of a control procedure by the supply control section of the second embodiment.

Normal state checking section 80 controls the opening and closing of power supply side switch 78 according to the flowchart illustrated in FIG. 8. For example, normal state checking section 80 tries to communicate with multiple board work machines WM0 each time the predetermined time elapses and determines whether the communication with at least one board work machine WM0 among multiple board work machines WM0 cannot be performed (step S11). As described above, multiple board work machines WM0 constituting board production line 1 are configured to be capable of inputting and outputting various data to and from line control device LC0 via a network. Normal state checking section 80 transmits a normal state checking signal to, for example, control device 14 of board work machine WM0 illustrated in FIG. 7. Control device 14 drives and controls each device constituting board work machine WM0.

The normal state checking signal is not limited. As the normal state checking signal, for example, PING can be used. In this case, normal state checking section 80 transmits a predetermined message to control device 14 of each of multiple board work machines WM0. Thereafter, normal state checking section 80 measures the time required from the time when the message is transmitted to the time when the reply to the message is received. Normal state checking section 80 determines that the communication with board work machine WM 0 can be performed when the reply is received before the predetermined time elapses and determines that the communication with board work machine WM 0 cannot be performed when the reply is not received before the predetermined time elapses.

When the communication with at least one board work machine WM0 cannot be performed (No in step S11), normal state checking section 80 determines that the normal state of board work machine WM0 cannot be checked (step S12). Thereafter, normal state checking section 80 sets power supply side switch 78 (step S13) to the open state, and the control is temporarily ended. When the communication with all board work machines WM0 can be performed (Yes in step S11), normal state checking section 80 determines that the normal state of board work machine WM0 is checked (step S14), and the control is temporarily ended.

Electric power supply circuit 73 may include a watchdog timer. The watchdog timer resets a counter before the counter reaches a predetermined value at a cycle shorter than the predetermined time and outputs a state signal, which indicates time over when the predetermined time elapses and the counter reaches the predetermined value. In this case, normal state checking section 80 can determine that the normal state cannot be checked when the state signal indicating the time over is acquired from the watchdog timer.

The watchdog timer can be provided, for example, in a control device that drives and controls discharge circuit DS0 and electric power converter INV0 of electric power supply circuit 73 illustrated in FIG. 5. Further, the watchdog timer may be provided in a power supply monitoring device or the like that monitors the DC power (DC power Vdc1) input via power distribution section 72. As described above, the watchdog timer can be achieved with hardware. The watchdog timer may also be achieved with software.

For example, normal state checking section 80 tries to communicate with multiple board work machines WM0 each time the predetermined time elapses and may determine that the normal state cannot be checked when the communication with at least one board work machine WM0 among multiple board work machines WM0 cannot be performed and when the state signal indicating the time over is acquired from the watchdog timer Further, supply control section 74 may be a combination of the first embodiment and the second embodiment. Specifically, supply control section 74 includes electromagnetic contactor 75, excitation circuit 76, work machine side switch 77, power supply side switch 78, and normal state checking section 80. Further, in excitation circuit 76, electromagnetic coil 751, work machine side switch 77, and power supply side switch 78 are connected in series. In this embodiment, since two stopping methods of stopping the supply of the electric power to electric power supply circuit 73 are provided, even when a failure occurs in the first stopping method, the supply of the electric power to electric power supply circuit 73 can be stopped by using the second stopping method, thereby the reliability of power supply shutoff device 70 is improved as compared with the embodiment provided with one stopping method.

1-7. Other

As illustrated in FIG. 5, since the DC power is supplied to electric power supply circuit 73 via power distribution section 72, electric power supply circuit 73 includes smoothing capacitor C0 that smoothes the DC power generated by power supply device 71. Even when the supply of the electric power to electric power supply circuit 73 is stopped by supply control section 74, there is a possibility that an electric charge remains in smoothing capacitor C0.

Therefore, electric power supply circuit 73 may include discharge circuit DS0. Discharge circuit DS0 discharges the electric charge remaining in smoothing capacitor C0 when the output of the DC power is stopped by supply control section 74. Discharge circuit DS0 only needs to be able to discharge the electric charge remaining in smoothing capacitor C0 when the output of the DC power is stopped by supply control section 74, and may take various forms.

Discharge circuit DS0 of the present embodiment includes switching element TR0 and resistor R0. Switching element TR0 and resistor R0 are connected in series and are connected in parallel with smoothing capacitor C0. When the output of the DC power is stopped by supply control section 74, the control device of electric power supply circuit 73 can control switching element TR0 from the open state to the closed state for a predetermined time and then discharge the electric charge remaining in smoothing capacitor C0.

Further, discharge circuit DS0 may include a current detector that detects the current flowing through resistor R0. In this case, the control device of electric power supply circuit 73 can also perform constant current control for controlling the opening and closing of switching element TR0 based on the detection result of the current detector so that the current flowing through resistor R0 is kept constant.

As described above, a bus connection is conceivable as an embodiment for supplying the electric power, which is generated by power supply device 71, to each of multiple board work machines WM0. In the bus connection, electric power supply circuits 73 of each of multiple board work machines WM0 are connected to a common power supply line in parallel. However, in this embodiment, it is necessary to dispose a power supply line in advance so that it is difficult to expand and contract the power supply line. Therefore, in this embodiment, for example, it is difficult to increase or decrease the number of board work machines WM0 in accordance with a production plan.

Therefore, in the present embodiment, power supply device 71 and multiple board work machines WM0 are connected in a daisy chain manner. As a result, the number of board work machines WM0 can be easily increased or decreased. For example, when board work machine WM0 is added, electric power supply circuit 73 of the last board work machine WM0 before the addition and electric power supply circuit 73 of board work machine WM0, which is to be added, are electrically connected to each other. Further, connection section 761 illustrated in FIGS. 4 and 6 forming excitation circuit 76 is electrically opened in the last board work machine WM0 before the addition and is electrically connected in board work machine WM0, which is to be added. In FIGS. 4 and 6, for convenience of illustration, connection positions indicated by white circles are illustrated so as to be shifted in the right direction of the drawing. The electrically opened part is indicated by dashed lines.

Figure 9:
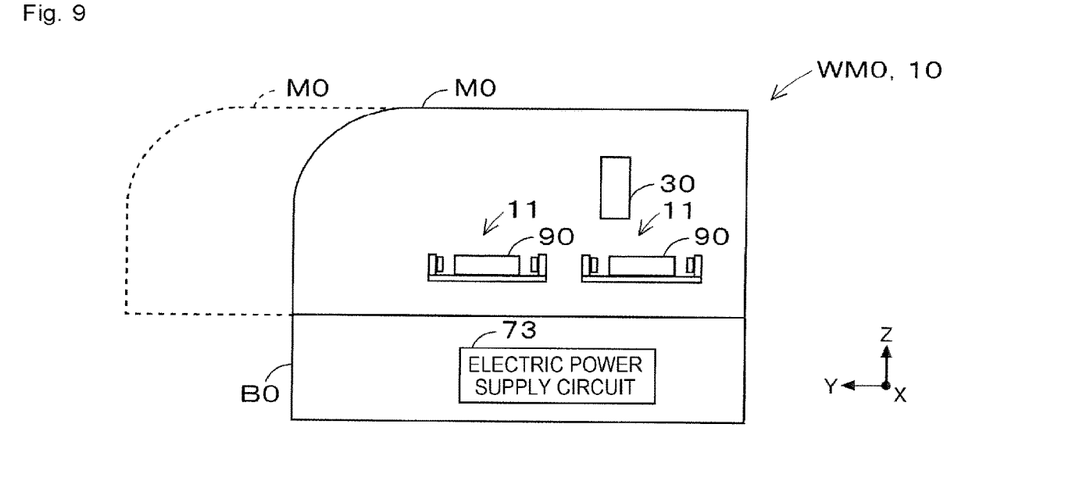
FIG. 9 is a schematic view illustrating a configuration example of the component mounter as viewed from the side.

Further, as illustrated in FIG. 9, board production line 1 of the present embodiment is provided with board work machine WM0, which includes base B0 and work module M0 provided so as to be capable of being pulled out on base B0, such that the number of board work machines WM0 is capable of being increased and decreased. Work module M0 is provided with board conveyance device 11, mounting head 30, and the like described above. Therefore, electric power supply circuit 73 is provided on base B0.

Work module M0, which is indicated by solid lines in FIG. 9, indicates a state in which work module M0 is mounted on base B0 at a mounting position. Work module M0, which is indicated by dashed lines, indicates a state in which work module M0 is pulled out from the mounting position. For example, when the maintenance of board work machine WM0 is performed, the worker can operate the breaker, shut off the drive electric power of board work machine WM0, and then pull out work module M0. When the maintenance is ended, the worker pulls back work module M0 to the mounting position of base B0. When work module M0 is pulled back to the mounting position of base B0, the worker can operate the breaker to input the drive electric power of board work machine WM0.

Power supply device 71 may also generate the AC power. In this case, power distribution section 72 sequentially distributes the AC power, which is generated by power supply device 71, from board work machine WM0 on a first end side of board production line 1 to board work machine WM0 on a second end side of board production line 1. However, in this embodiment, each of multiple board work machines WM0 requires an electric power converter that converts the input AC power into the DC power. Therefore, power supply device 71 of the present embodiment generates the DC power. Further, although a switch may be provided on the output side of power supply device 71 that generates the DC power, the switch may be larger in size as compared with the case where the AC power is intermittently supplied, thereby there is a possibility that the cost will increase. Therefore, in the present embodiment, electromagnetic contactor 75 is provided on the input side of power supply device 71.

Further, as an embodiment for supplying the electric power, which is generated by power supply device 71, to each of multiple board work machines WM0, a star connection is conceivable. Also in this embodiment, power distribution section 72 can distribute the electric power, which is generated by power supply device 71, to each of multiple board work machines WM0. However, in this embodiment, power supply shutoff device 70 can include supply control section 74 of the second embodiment provided in the work machine, in which excitation circuit 76 and power supply side switch 78 include power supply device 71, but it is difficult to include supply control section 74 of the first embodiment. Therefore, in the present embodiment, power supply device 71 and multiple board work machines WM0 are connected in a daisy chain manner. As a result, the variation of supply control section 74 increases, and as described above, the reliability of power supply shutoff device 70 can also be improved by using the multiple stopping methods.

2. Power Supply Shutoff Method

What has been described above with respect to power supply shutoff device 70 can be said in the same manner as for the power supply shutoff method. The power supply shutoff method is applied to power feeding system 60 including movable section 51, driving section 53, power supply device 71, power distribution section 72, and electric power supply circuit 73, and includes a supply control step. The supply control step corresponds to control performed by supply control section 74. The power supply shutoff method may include a normal state checking step. The normal state checking step corresponds to control performed by normal state checking section 80.

3. Example of Effects of Embodiment

Power supply shutoff device 70 includes supply control section 74. Therefore, power supply shutoff device 70 can stop the supply of the electric power to electric power supply circuit 73 when the drive electric power for driving board work machine WM0 is shut off. What has been described above with respect to power supply shutoff device 70 can be said in the same manner as for the power supply shutoff method.

REFERENCE SIGNS LIST

1: board production line
40R: traveling path
51: movable section

53: driving section
60: power feeding system
70: power supply shutoff device
71: power supply device
72: power distribution section
73: electric power supply circuit
74: supply control section
75: electromagnetic contactor
751: electromagnetic coil
76: excitation circuit
77: work machine side switch
78: power supply side switch
80: normal state checking section
C0: smoothing capacitor
DS0: discharge circuit
90: board
B0: base
M0: work module
WM0: board work machine

The invention claimed is:

1. A power supply shutoff device comprising:
a movable section configured to travel on a traveling path provided along a board production line in which multiple board work machines, which perform a predetermined board work on a board, are installed side by side;
a driving section provided in the movable section and configured to cause the movable section to travel by using supply electric power supplied from the board work machine with non-contact power feeding;
a power supply device configured to generate electric power;
a power distribution section configured to distribute the electric power generated by the power supply device to each of the multiple board work machines;
an electric power supply circuit provided in each of the multiple board work machines and configured to generate the supply electric power to be supplied to the driving section by using the electric power distributed via the power distribution section; and
a supply control section configured to stop a supply of the electric power to the electric power supply circuit when drive electric power for driving the board work machine is shut off in at least one board work machine among the multiple board work machines, the supply control section including
an electromagnetic contactor that is provided on an input side of the power supply device and capable of inputting AC power to the power supply device when an electromagnetic coil is excited,
an excitation circuit that excites the electromagnetic coil, and
a switch configured to break the excitation circuit to stop the supply of the electric power via the electromagnetic contactor when the drive electric power of at least one board work machine among the multiple board work machines is shut off.

2. The power supply shutoff device according to claim 1, wherein the power supply device and the multiple board work machines are connected in a daisy chain manner, and
the power distribution section sequentially distributes the electric power, which is generated by the power supply device, from the board work machine on a first end side of the board production line to the board work machine on a second end side of the board production line.

3. The power supply shutoff device according to claim 2, wherein
the switch is a work machine side switch that is provided in each of the multiple board work machines and releases the excitation circuit when the drive electric power of at least one board work machine among the multiple board work machines is shut off, and
in the excitation circuit, the electromagnetic coil and the work machine side switch are connected in series.

4. The power supply shutoff device according to claim 3, wherein the work machine side switch is a breaker capable of inputting or shutting off the drive electric power of the board work machine by a worker.

5. The power supply shutoff device according to claim 1, wherein
the switch is a power supply side switch that is provided in a work machine including the power supply device and releases the excitation circuit when the drive electric power of at least one board work machine among the multiple board work machines is shut off, and
a normal state checking section that checks for a normal state in which the board work machine is being operated normally for the multiple board work machines each time a predetermined time elapses,
in the excitation circuit, the electromagnetic coil and the power supply side switch are connected in series, and
the normal state checking section sets the power supply side switch to an open state when the normal state cannot be checked for at least one board work machine among the multiple board work machines.

6. The power supply shutoff device according to claim 5, wherein the normal state checking section tries to communicate with the multiple board work machines each time the predetermined time elapses and determines that the normal state cannot be checked when communication with at least one board work machine among the multiple board work machines cannot be performed.

7. The power supply shutoff device according to claim 5, wherein the electric power supply circuit includes a watchdog timer, which resets a counter before the counter reaches a predetermined value in a cycle shorter than the predetermined time and outputs a state signal indicating a time over when the predetermined time has elapsed and the counter has reached the predetermined value, and
the normal state checking section determines that the normal state cannot be checked when the state signal is acquired from the watchdog timer.

8. The power supply shutoff device according to claim 1, wherein the power supply device generates DC power, and
the electric power supply circuit includes
a smoothing capacitor that smoothes the DC power, and
a discharge circuit that discharges an electric charge remaining in the smoothing capacitor when an output of the DC power is stopped by the supply control section.

9. The power supply shutoff device according to claim 1, wherein the board production line is provided with the board work machine, which includes a base and a work module provided so as to be capable of being pulled out on the base, such that a number of board work machines is capable of being increased and decreased, and
the electric power supply circuit is provided on the base.

10. The power supply shutoff device according to claim 1, wherein the power supply device generates DC power.

11. A power supply shutoff method that is applied to a power feeding system including
- a movable section that is capable of traveling on a traveling path provided along a board production line in which multiple board work machines, which perform a predetermined board work on a board, are installed side by side,
- a driving section that is provided in the movable section and causes the movable section to travel by using supply electric power supplied from the board work machine with non-contact power feeding,
- a power supply device that generates electric power,
- a power distribution section that distributes the electric power generated by the power supply device to each of the multiple board work machines, and
- an electric power supply circuit that is provided in each of the multiple board work machines and generates the supply electric power to be supplied to the driving section by using the electric power distributed via the power distribution section, the power supply shutoff method comprising:
- a supply control step of stopping a supply of the electric power to the electric power supply circuit when drive electric power for driving the board work machine is shut off in at least one board work machine among the multiple board work machines, the supply control step including
  - inputting AC power to the power supply device with an electromagnetic contactor when an electromagnetic coil is excited by an excitation circuit, and
  - stopping the supply of the electric power via the electromagnetic contactor by a switch breaking the excitation circuit when the drive electric power of at least one board work machine among the multiple board work machines is shut off.

* * * * *